United States Patent
Yoo et al.

(10) Patent No.: US 8,525,706 B2
(45) Date of Patent: Sep. 3, 2013

(54) METHOD AND APPARATUS FOR ENCODING AND DECODING DATA

(75) Inventors: Ki-won Yoo, Seoul (KR); Chang-su Han, Seoul (KR); Yong-hoon Yu, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 193 days.

(21) Appl. No.: 13/100,494

(22) Filed: May 4, 2011

(65) Prior Publication Data

US 2011/0309958 A1 Dec. 22, 2011

(30) Foreign Application Priority Data

Jun. 17, 2010 (KR) .................. 10-2010-0057374

(51) Int. Cl.
*H03M 7/34* (2006.01)
(52) U.S. Cl.
USPC .............................. 341/51; 341/50
(58) Field of Classification Search
USPC ............ 341/50, 51; 704/230, 225, 212
See application file for complete search history.

(56) References Cited

U.S. PATENT DOCUMENTS

| | | | |
|---|---|---|---|
| 6,930,618 B2 * | 8/2005 | Touyama et al. | 341/51 |
| RE41,370 E * | 6/2010 | Takamizawa et al. | 341/51 |
| 2002/0049586 A1 * | 4/2002 | Nishio et al. | 704/230 |
| 2004/0064310 A1 * | 4/2004 | Banba et al. | 704/212 |
| 2007/0150267 A1 * | 6/2007 | Honma et al. | 704/225 |

FOREIGN PATENT DOCUMENTS

JP 08-213915 A 8/1996

* cited by examiner

*Primary Examiner* — Jean B Jeanglaude
(74) *Attorney, Agent, or Firm* — Sughrue Mion, PLLC

(57) ABSTRACT

The method for encoding data includes: receiving data; determining one quantizer from among a plurality of quantizers having a same quantization step size and different offset values; and transmitting an indicator and a quantized coefficient related to the determined quantizer. The method for decoding data includes: receiving an indicator and a quantized coefficient related to a quantizer; determining one de-quantizer from among a plurality of de-quantizers by using the indicator; and acquiring reconstructed data by de-quantizing the quantized coefficient by using the determined de-quantizer.

25 Claims, 7 Drawing Sheets

METHOD AND APPARATUS FOR ENCODING AND DECODING DATA

CROSS-REFERENCE TO RELATED PATENT APPLICATION

This application claims priority from Korean Patent Application No. 10-2010-0057374, filed on Jun. 17, 2010 in the Korean Intellectual Property Office, the disclosure of which is incorporated herein in its entirety by reference.

BACKGROUND

1. Field

Apparatuses and methods consistent with exemplary embodiments relate to encoding and encoding data, and more particularly, to reconstructing data received from an encoder by using a plurality of de-quantizers.

2. Description of the Related Art

In order to encode data, an encoder compresses voice or image data into a quantized coefficient by using a quantizer, and transmits the quantized coefficient to a decoder.

The decoder receives the quantized coefficient from the encoder, and generates reconstructed data by applying the received quantized coefficient to a de-quantizer of the decoder. Here, an error having a value smaller than a quantized step size may occur between original data input to the encoder and the reconstructed data output from the decoder.

SUMMARY

According to an aspect of an exemplary embodiment, there is provided an apparatus for encoding data, the apparatus including: an input unit which receives data; a quantization unit which acquires quantized coefficients respectively corresponding to a plurality of quantizers by applying the plurality of quantizers to the data, wherein the plurality quantizers have the same quantization step sizes and different offset values; a quantizer determination unit which determines one quantizer from among the plurality of quantizers by using the quantized coefficients respectively corresponding to the plurality of quantizers; and a multiplexing unit which generates a data stream by combining a quantized coefficient acquired from the determined quantizer, and an indicator indicating the determined quantizer.

The quantizer determination unit may de-quantize the quantized coefficients respectively corresponding to the plurality of quantizers to acquire reconstructed values respectively corresponding to the plurality of quantizers, and determine the one quantizer from among the plurality of quantizers based on an error between the reconstructed values and the data.

When the data is data in units of predetermined blocks, the quantization unit may apply the same quantizer to a plurality of pieces of data in a predetermined block.

The indicator may be determined in the units of the predetermined blocks.

The data may correspond to a difference between current data and predictive data.

When the plurality of quantizers are applied to the data, the quantization unit may apply scaling information for adjusting a quantization step size to the plurality of quantizers, and then apply the plurality of quantizers to which the scaling information is applied to the data, and the multiplexing unit may generate a data stream by further combining the scaling information while generating the data stream.

According to an aspect of another exemplary embodiment, there is provided an apparatus for encoding data, the apparatus including: an input unit which receives data; a quantization unit which acquires quantized coefficients respectively corresponding to a plurality of quantizers by applying the plurality of quantizers to the data, wherein the plurality of quantizers have the same quantization step sizes and different offset values; a quantizer determination unit which determines one quantizer from among the plurality of quantizers by using the quantized coefficients respectively corresponding to the plurality of quantizers; and a multiplexing unit which generates a data stream by combining a quantized coefficient acquired from the determined quantizer, and offset information of the determined quantizer.

The quantizer determination unit may acquire reconstructed values respectively corresponding to the plurality of quantizers by de-quantizing the quantized coefficients respectively corresponding to the plurality of quantizers, and determine the one quantizer from among the plurality of quantizers based on an error between the reconstructed values and the data.

When the data is data in units of predetermined blocks, the quantization unit may apply the same quantizer to a plurality of pieces of data in a predetermined block.

The offset information may be determined in the units of the predetermined blocks.

The data may correspond to a difference between current data and predictive data.

The offset information may be one of an offset value of the determined quantizer or information for acquiring the offset value.

When the plurality of quantizers are applied to the data, the quantization unit may apply scaling information for adjusting a quantization step size to the plurality of quantizers, and then apply the plurality of quantizers to which the scaling information is applied to the data, and the multiplexing unit may generate a data stream by further combining the scaling information while generating the data stream.

According to an aspect of another exemplary embodiment, there is provided an apparatus for decoding data, the apparatus including: a de-multiplexing unit which de-multiplexes a quantized coefficient and an indicator corresponding to a quantizer from a data stream; a de-quantization unit which determines a de-quantizer from among a plurality of de-quantizers by using the indicator, and acquires reconstructed data by applying the quantized coefficient to the determined de-quantizer, wherein the de-quantizers have the same quantization step sizes and different offset values; and an output unit for outputting the reconstructed data.

When the data stream includes data encoded in units of predetermined blocks, the de-quantization unit may apply the de-quantizer to a plurality of pieces of data in the predetermined block.

The indicator may be determined in the units of predetermined blocks.

The reconstructed data may correspond to a difference between current data and predictive data.

The de-multiplexing unit may further de-multiplex scaling information for adjusting a quantization step size of the determined de-quantizer, and the de-quantization unit may acquire the reconstructed data by applying the scaling information and the quantization coefficient to the determined de-quantizer.

According to an aspect of another exemplary embodiment, there is provided an apparatus for decoding data, the apparatus including: a de-multiplexing unit which de-multiplexes a quantized coefficient and offset information of a quantizer from a data stream; a de-quantization unit which de-quantizes the quantized coefficient by using the offset information, and acquires the reconstructed data; and an output unit which outputs the reconstructed data.

The data stream may include data encoded in units of predetermined blocks, and the offset information may be determined in the units of predetermined blocks.

The de-quantization unit may include a plurality of de-quantizers for decoding data encoded in units of blocks, de-quantize the quantized coefficient by applying the offset information to the de-quantizers, and acquire the reconstructed data.

The de-quantization unit may include a plurality of de-quantizers for decoding data encoded in units of blocks, the de-multiplexing unit may further de-multiplex a plurality of pieces of offset information, and the de-quantization unit may de-quantize the quantized coefficient by applying the plurality of pieces of offset information to each of the de-quantizers, and acquire the reconstructed data.

The reconstructed data may correspond to a difference between current data and predictive data.

The offset information may be one of an offset value of the quantizer and information for acquiring the offset value.

The de-quantization unit may adjust an offset value of a de-quantizer included in the de-quantization unit, and acquire the reconstructed data by applying the quantized coefficient to the de-quantizer of which the offset value is adjusted.

The de-quantization unit may adjust the quantized coefficient by using the offset information, and acquire the reconstructed data by applying the adjusted quantized coefficient on a de-quantizer included in the de-quantization unit.

The information for acquiring the offset value may be a value for dividing a de-quantization step size of a de-quantizer included in the de-quantization unit into a predetermined size, or a value representing the offset value.

The de-multiplexing unit may further de-multiplex scaling information for adjusting a quantization step size of the determined de-quantizer, and the de-quantization unit may de-quantize the quantized coefficient by applying the scaling information and the offset information, and acquire the reconstructed data.

According to an aspect of another exemplary embodiment, there is provided a method of encoding data, the method including: receiving data; acquiring quantized coefficients respectively corresponding to a plurality of quantizers by applying the quantizers to the data, wherein the plurality of quantizers have the same quantization step sizes and different offset values; determining one quantizer from among the plurality of quantizers by using the quantized coefficients; and generating a data stream by combining a quantized coefficient acquired from the determined quantizer, and an indicator indicating the determined quantizer.

The determining the one quantizer from among the plurality of quantizers may include: acquiring a reconstructed value by de-quantizing the quantized coefficient; and determining the one quantizer from among the plurality of quantizers based on an error between the reconstructed value and the data.

When the data is data in units of predetermined blocks, the determined quantizer may be applied to a plurality of pieces of data in the predetermined block.

The indicator may be determined in units of predetermined blocks.

The data may correspond to a difference between current data and predictive data.

The acquiring the quantized coefficients may include, when the quantizers are applied to the data, applying scaling information for adjusting the quantization step size to the plurality of quantizers, and the generating the data stream may include generating the data stream by including the scaling information.

According to an aspect of another exemplary embodiment, there is provided a method of encoding data, the method including: receiving data; acquiring quantized coefficients respectively corresponding to a plurality of quantizers by applying the plurality of quantizers to the data, wherein the plurality of quantizers have the same quantization step sizes and different offset values; determining one quantizer from among the plurality of quantizers by using the quantized coefficients; and generating a data stream by combining a quantized coefficient acquired from the determined quantizer, and offset information of the determined quantizer.

The quantization step sizes of the plurality of quantizers may be the same, and the offset values of the plurality of quantizers may be different from each other.

The determining the one quantizer from among the plurality of quantizers may include: acquiring a reconstructed value by de-quantizing the quantized coefficient; and determining the one quantizer from among the plurality of quantizers based on an error between the reconstructed value and the data.

When the data is data in units of predetermined blocks, the same quantizers may be applied to a plurality of pieces of data in the predetermined block.

The offset information may be determined in the units of the predetermined blocks.

The data may correspond to a difference between current data and predictive data.

The offset information may be one of an offset value of the quantizer and information for acquiring the offset value.

The acquiring the quantized coefficient may include, when the plurality of quantizers are applied to the data, applying scaling information for adjusting a quantization step size on the plurality of quantizers, and the generating the data stream may include generating a data stream by combining the scaling information.

According to an aspect of another exemplary embodiment, there is provided a method of decoding data, the method including: de-multiplexing a quantized coefficient and an indicator corresponding to a quantizer from a data stream; determining one de-quantizer from among a plurality of de-quantizers by using the indicator, wherein the plurality of de-quantizers have the same quantization step sizes and different offset values; acquiring reconstructed data by applying the quantized coefficient to the determined de-quantizer; and outputting the reconstructed data.

When the data stream includes data encoded in units of predetermined blocks, the same de-quantizer may be applied to a plurality of pieces of data in the predetermined block.

The indicator may be determined in the units of predetermined blocks.

The reconstructed data may correspond to a difference between current data and predictive data.

The de-multiplexing may include de-multiplexing scaling information for adjusting a quantization step size of the determined de-quantizer, and the acquiring the reconstructed data may include applying the scaling information when the quantized coefficient is applied to the determined de-quantizer.

According to an aspect of another exemplary embodiment, there is provided a method of decoding data, the method including: de-multiplexing a quantization coefficient and offset information of a quantizer from a data stream; de-quantizing the quantized coefficient by applying the offset information, and acquiring reconstructed data; and outputting the reconstructed data.

The data stream may include data encoded in units of predetermined blocks, and the offset information may be determined in the units of predetermined blocks.

When the data stream includes the data encoded in the units of predetermined blocks, the acquiring the reconstructed data may include de-quantizing the quantized coefficient by applying the offset information to a plurality of de-quantizers, and acquiring the reconstructed data.

When there are a plurality of pieces of offset information and the data stream includes data encoded in units of predetermined blocks, the acquiring the reconstructed data may include de-quantizing the quantized coefficient by applying the plurality of pieces of offset information to each of a plurality of de-quantizers, and acquiring the reconstructed data.

The reconstructed data may correspond to a difference between current data and predictive data.

The offset information may be one of an offset value of the quantizer and information for acquiring the offset value.

The acquiring the reconstructed data may include: adjusting an offset value of a de-quantizer included in the de-quantization unit by using the offset information; and acquiring the reconstructed data by applying the quantized coefficient to the de-quantizer of which the offset value is adjusted.

The acquiring the reconstructed data may include: adjusting the quantized coefficient by using the offset information; and acquiring the reconstructed data by applying the adjusted quantized coefficient to a de-quantizer included in the de-quantization unit.

The information for acquiring the offset value may be a value for dividing a de-quantization step size of a de-quantizer included in the de-quantization unit into a predetermined size, or a value representing the offset value.

The de-multiplexing may include de-multiplexing scaling information for adjusting a quantization step size of the determined de-quantizer, and the acquiring of the reconstructed data may include applying the scaling information.

According to an aspect of another exemplary embodiment, there is provided a method of encoding data, performed by an apparatus for encoding data, the method including: acquiring a plurality of quantized coefficients respectively corresponding to a plurality of quantizers by applying the plurality of quantizers to data, wherein each of the plurality of quantizers has an intrinsic offset value; determining one quantizer from among the plurality of quantizers by using the acquired plurality of quantized coefficients respectively corresponding to the plurality of quantizers; and generating a data stream by combining a quantized coefficient corresponding to the determined quantizer, and information corresponding to the determined quantizer, wherein quantization step sizes of the plurality of quantizers are equal, and offset values of the plurality of quantizers are different from each other.

BRIEF DESCRIPTION OF THE DRAWINGS

The above and other features and advantages will become more apparent by describing in detail exemplary embodiments with reference to the attached drawings in which.

DETAILED DESCRIPTION OF EXEMPLARY EMBODIMENTS

Figure 1:
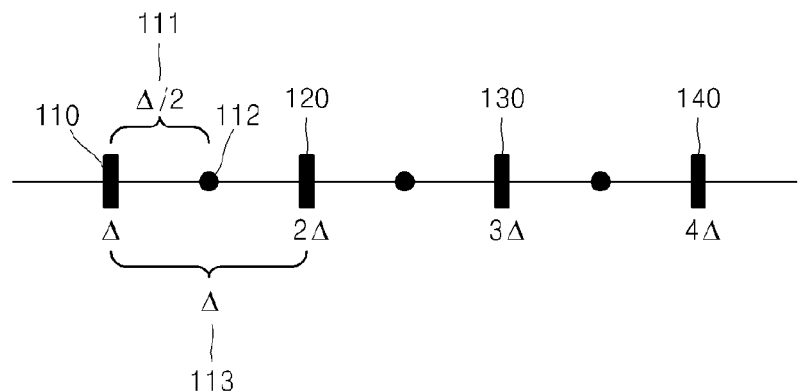
FIG. 1 is a diagram for describing a quantization process of a quantizer according to a related art.

Hereinafter, exemplary embodiments will be described more fully with reference to the accompanying drawings. Exemplary embodiments may, however, be embodied in many different forms and should not be construed as being limited to the exemplary embodiments set forth herein; rather, these exemplary embodiments are provided so that this disclosure will be thorough and complete, and will fully convey the inventive concept to those of ordinary skill in the art. In the drawings, like reference numerals denote like elements. Expressions such as "at least one of," when preceding a list of elements, modify the entire list of elements and do not modify the individual elements of the list.

An encoder according to an exemplary embodiment acquires quantized coefficients by applying each of a plurality of quantizers to data. Then, the encoder de-quantizes the quantized coefficients to calculate an error between reconstructed value and original data, and determines a quantizer that outputs a quantized coefficient having the smallest error. Here, quantization step sizes of the quantizers of the encoder are the same, whereas offset values of the quantizers are different from each other. Next, the encoder generates a data stream by combining the quantized coefficient having the smallest error with an indicator indicating the determined quantizer or an offset value of the determined quantizer. The generated data stream may be transmitted to a decoder through a predetermined channel.

A decoder according to an exemplary embodiment selects one of a plurality of de-quantizers by using an indicator received from an encoder, or adjusts an offset value of a de-quantizer by using an offset value received from the encoder. Then, the decoder acquires reconstructed data by applying a quantized coefficient received from the encoder on the de-quantizer selected by using the indicator. Alternatively, the decoder acquires the reconstructed data by applying the quantized coefficient received from the encoder on the de-quantizer of which the offset value is adjusted. When the data reconstructed by the decoder is image data, the decoder may provide the image data to a user via a display unit.

FIG. 1 is a diagram for describing a quantization process of a quantizer 100 according to a related art.

The quantizer 100 of FIG. 1 has consecutive decision levels 110 through 140, wherein an interval between the decision levels 110 through 140 has a size of Δ 113 as a quantization step size. When original data received from the quantizer 100 is included in the interval between the decision level 110 and the decision level 120, the quantizer 100 may output a quantized coefficient that is reconstructable as a quantization representative value 112 corresponding to the original data. The quantization representative value 112 corresponding to the original data may be expressed as an intermediate value between the decision levels 110 and 120, or as a median value between the decision levels 110 and 120.

An error generated during the quantization process may be calculated from a difference between the original data received by the quantizer 100 and a reconstructed value acquired from the quantized coefficient. If the original data is included in the interval between the decision levels 110 and 120, and the quantization representative value 112 is acquired as the reconstructed value of the original data in FIG. 1, a range of an error between the original data and the reconstructed value may be from 0 to $\Delta/2$ 111. For example, when data having a size of 10 bits is applied to a quantizer having 128 representative values, a quantization step size may be 8 and the error range may be from 0 to 4.

If the original data is data formed of units of blocks, an error between the original data in the units of blocks and a value of reconstructed units of blocks may increase. For example, when a block including 4 pieces of data each having a size of 10 bits is applied to a quantizer having 128 representative values, a range of error may be from 0 to 16.

Figure 2:
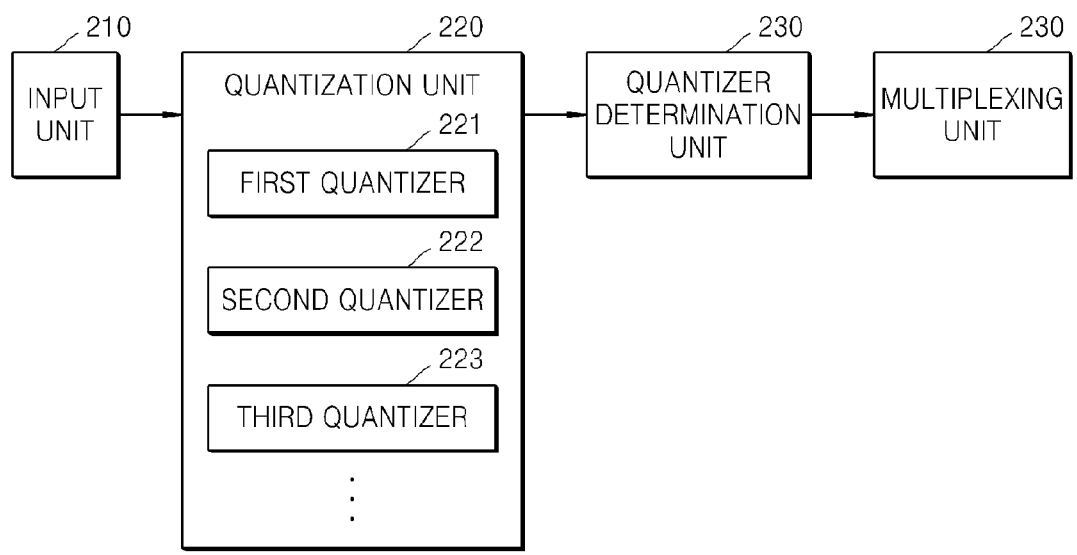
FIG. 2 is a block diagram of an encoder according to an exemplary embodiment.

FIG. 2 is a block diagram of an encoder 200 according to an exemplary embodiment.

Referring to FIG. 2, the encoder 200 includes an input unit 210, a quantization unit 220, a quantizer determination unit 230, and a multiplexing unit 240.

An encoder is an apparatus for encoding and compressing image or voice data. Examples of the encoder include a camera, a camcorder, a set-top box, a voice recorder, a computer, etc.

The input unit 210 is a unit for receiving data. Examples of the data include data having various formats, such as a still image, a moving image, voice, a text, data in a frequency format, etc. Alternatively, the input unit 210 may receive data on which preprocessing is performed. The preprocessed data is data that is processed before being input to the input unit 210, and for example, may be residual data corresponding to a difference between current data that is currently encoded and predictive data found in a range adjacent to the current data.

The input unit 210 may receive data that is preprocessed in units of blocks. The data that is preprocessed in units of blocks may include a residual block corresponding to a difference between the current block and the predictive block. The data in units of blocks may be processed in units of blocks by the quantization unit 220, the quantizer determination unit 230, and the multiplexing unit 240.

The quantization unit 220 acquires quantized coefficients respectively corresponding to a plurality of quantizers 221 through 223 by applying the quantizers 221 through 223 to the original data input to the input unit 210. Here, quantization step sizes of the quantizers 221 through 223 on which the original data is applied are the same, whereas offset values of the quantizers 221 through 223 are different from each other.

When the quantizers 221 through 223 having the same quantization step sizes are interleaved, the offset values may be differences between each of the quantizers 221 through 223 and the quantization step. Here, the quantizers 221 through 223 may each have an intrinsic offset value.

For example, when a difference between quantization steps of two quantizers is $\Delta/2$ and an offset value is set to 0 based on one quantizer, an offset value of another quantizer may be $\Delta/2$. Also, when differences of two quantizers from among three quantizers are respectively $\Delta/2$ and $\Delta/3$ based on a remaining quantizer, offset values of the three quantizers may respectively be 0, $\Delta/2$, and $\Delta/3$. Meanwhile, a quantization step of a quantizer may be divided linearly or non-linearly.

In order to output the quantized coefficients respectively corresponding to the quantizers 221 through 223, the quantization unit 220 determines whether the received original data is included in an interval between predetermined decision levels. If the original data is included in the interval between the predetermined decision levels, the quantization unit 220 outputs a quantization coefficient obtained by dividing the original data by the interval between the predetermined decision levels. Here, values of the quantized coefficients may be the same or different from each other.

If the received original data is data included in a predetermined block, the quantization unit 220 may apply the same quantizer to all pieces of data included in the block. Alternatively, the quantization unit 220 may apply the same quantizer to some pieces of data from among a plurality of pieces of data in one block.

The quantization unit 220 may apply scaling information for adjusting the quantization step sizes of the quantizers 221 through 223. The quantization unit 220 may output the quantized coefficient related to the original data by applying the quantizers 221 through 223 applied with the scaling information to the original data.

The scaling information may include a scaling value or a value representing the scaling value, as information for increasing or decreasing a quantization step size. The same value or different values of the scaling information may be applied to the quantizers 221 through 223. The value of the scaling information may be a natural number or a real number. Meanwhile, if the data is data in a predetermined block, the quantization unit 220 may apply the same quantizer applied with the scaling information to some pieces of data from among a plurality of pieces of data in the predetermined block. Alternatively, the quantization unit 220 may apply the same quantizer applied with the scaling information to all pieces of data in the predetermined block.

The quantizer determination unit 230 determines one quantizer from among the quantizers 221 through 223 by using the quantized coefficients respectively corresponding to the quantizers 221 through 223. For example, the quantizer determination unit 230 acquires reconstructed values respectively corresponding to the quantizers 221 through 223 by de-quantizing the quantized coefficients respectively corresponding to the quantizers 221 through 223, and determines one quantizer based on errors between the reconstructed values and the original data. At least one of a sum of absolute differences (SAD) and a squared sum of differences (SSD) may be used to calculate the errors between the reconstructed values and the original data.

The quantizer determination unit 230 determines a quantizer having the smallest error by comparing the errors acquired from the quantizers 221 through 223. Also, the quantizer determination unit 230 may transmit information related to the determined quantizer to the multiplexing unit 240.

The quantizer determination unit 230 may include an indicator indicating the determined quantizer or offset information of the determined quantizer as the information related to the determined quantizer. The indicator may be used to find a de-quantizer for de-quantizing a quantized coefficient received from the encoder 200 and acquiring reconstructed data, from a decoder.

The offset information of the determined quantizer is information related to an offset value of the determined quantizer, and may be one of an offset value of the determined quantizer or information for acquiring the offset value. The offset value may be smaller than Δ constituting a quantization step size of a quantizer, and may be from 0 to Δ/2.

The information for acquiring the offset value may include a value for dividing the quantization step size of the determined quantizer into a predetermined size, or a value representing the offset value. For example, when a Δ value of the quantization step size is 16 and the offset value is 8, the value for dividing the quantization step size into a predetermined size may be 2, i.e., 16/8. Alternatively, the offset value 8 may be indicated by a predetermined value representing the offset value 8, via an agreement between the encoder 200 and a decoder.

When the original data received from the input unit 210 is data included in a predetermined block, the quantizer determination unit 230 may determine the indicator or offset information in units of blocks. For example, the quantizer determination unit 230 acquires the reconstructed data by applying the data in the block to each of the quantizers 221 through 223. Also, the quantizer determination unit 230 may transmit information related to the quantizer having the smallest error to the multiplexing unit 240, by comparing the errors between the data in the block corresponding to each of the quantizers 221 through 223 and the reconstructed data.

The multiplexing unit 240 generates a data stream by combining the quantized coefficient corresponding to the determined quantizer and the indicator indicating the determined quantizer or the offset information of the determined quantizer. The multiplexing unit 240 may generate the data stream by further combining the scaling information for adjusting the quantization step size of the quantization unit 220. The multiplexing unit 240 may transmit the generated data stream to the decoder via a channel.

The multiplexing unit 240 may transmit one indicator or offset information per block regarding data included in a predetermined block. When the indicator or offset information is transmitted in units of blocks, the overhead is less as compared to when quantization information is transmitted in units of data, and thus reduction of overhead may lead to an increase in a data transmission rate.

Figure 3:
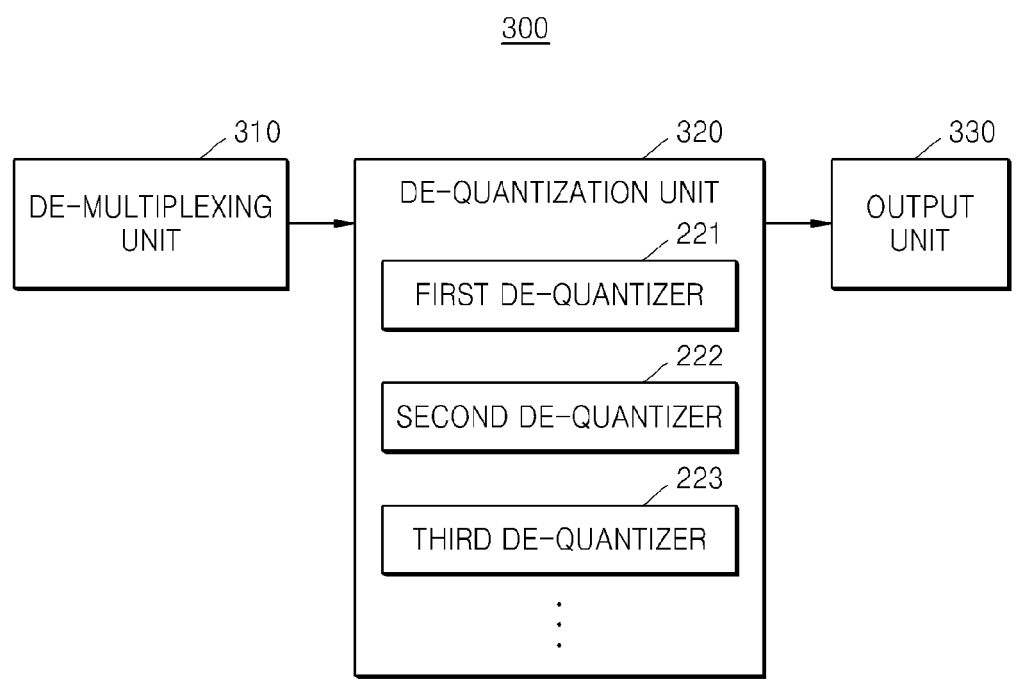
FIG. 3 is a block diagram of a decoder according to an exemplary embodiment.

FIG. 3 is a block diagram of a decoder 300 according to an exemplary embodiment.

Referring to FIG. 3, the decoder 300 includes a de-multiplexing unit 310, a de-quantization unit 320, and an output unit 330.

The decoder 300 is an apparatus for decoding compressed data received from the encoder 200 into data having various formats, such as a still image, a moving image, a text, audio, etc. Examples of the decoder 300 include a camera, a camcorder, a set-top box, a television, an MP3 player, and a computer.

The de-multiplexing unit 310 receives a data stream from the encoder 200, and de-multiplexes a quantized coefficient from the data stream. Also, the de-multiplexing unit 310 may de-multiplex at least one of an indicator corresponding to a quantizer and offset information of the quantizer. Also, the de-multiplexing unit 310 may de-multiplex scaling information for adjusting a quantization step size. The scaling information may include a scaling value or a value representing the scaling value, as information for increasing or decreasing the quantization step size.

When the received data includes data encoded in units of predetermined blocks, the de-multiplexing unit 310 may de-multiplex one indicator or at least one piece of offset information per block.

The de-quantization unit 320 may determine one de-quantizer from among a plurality of de-quantizers 321 through 323 by using the indicator de-multiplexed by the de-multiplexing unit 310, and acquire reconstructed data by applying a quantized coefficient to the de-quantizer determined based on the indicator. Here, quantization step sizes of the de-quantizers 321 through 323 may be the same, and offset values of the de-quantizers 321 through 323 may be different from each other.

In order for the quantization step sizes of the de-quantizers 321 through 323 to be the same and the offset values of the de-quantizers 321 through 323 to be different from each other, the de-quantizers 321 through 323 are interleaved, and a range of the offset value may be smaller than a de-quantization step size of one of the de-quantizers 321 through 323. Here, the quantization step sizes of the de-quantizers 321 through 323 may be divided linearly or non-linearly. Also, at least one of the de-quantizers 321 through 323 may be selected by using an indicator stored in a storage unit (not shown) of the encoder 300, or received from the encoder 200.

When the data stream received by the de-multiplexing unit 310 includes data encoded in units of predetermined blocks, the de-quantization unit 320 may apply the same de-quantizer to some pieces of data from among a plurality of pieces of data in a predetermined block. Alternatively, the de-quantization unit 320 may apply the same de-quantizer to all pieces of data in the predetermined block.

The de-quantization unit 320 acquires the reconstructed data by applying the quantized coefficient to the de-quantizer determined based on the indicator. For example, the de-quantization unit 320 may acquire the reconstructed data by multiplying the de-quantization step size of the de-quantizer determined based on the indicator and the quantized coefficient.

The de-quantization unit 320 may apply scaling information received from the de-multiplexing unit 310 so as to adjust the quantization step size of the de-quantizer determined based on the indicator. For example, the de-quantization unit 320 may apply the scaling information on the de-quantizer determined based on the indicator from among the quantizers 321 through 323, and acquire the reconstructed data by applying the quantized coefficient acquired by the de-multiplexing unit 310 on the de-quantizer applied with the scaling information. The scaling information may include a scaling value or a value representing the scaling value (e.g., a value used to obtain the scaling value), as information for increasing or decreasing a de-quantization step size. Meanwhile, when the data stream received by the de-multiplexing unit 310 includes data encoded in units of predetermined blocks, the de-quantization unit 320 may apply the same de-quantizer applied with the scaling information to some pieces of data from among a plurality of pieces of data in a predetermined block, or to all pieces of data in the predetermined block.

The de-quantization unit 320 may de-quantize the quantized coefficient by applying the offset information de-multiplexed by the de-multiplexing unit 310, and acquire the reconstructed data.

The offset information is information related to an offset value, and for example, may include an offset value of a quantizer or information for acquiring the offset value. Here, the information for acquiring the offset value may include a value for dividing the de-quantization step size of the de-quantizer included in the de-quantization unit 320 into a predetermined value, or a value representing the offset value.

When the reconstructed data is acquired by using the offset information, the de-quantization unit 320 may adjust the offset value of the de-quantizer included in the de-quantization unit 320 by using the offset information, and then acquire the reconstructed data by applying the quantized coefficient to the de-quantizer of which the offset value is adjusted. Alternatively, the de-quantization unit 320 may adjust the quantized coefficient by using the offset information, and then acquire the reconstructed data by applying the adjusted quantized coefficient to the de-quantizer included in the de-quantization unit 320.

When the data stream received by the de-multiplexing unit 310 includes data encoded in units of blocks including a plurality of quantized coefficients, the de-quantization unit 320 may apply the quantized coefficients to one de-quantizer. Alternatively, the de-quantization unit 320 may apply the de-quantizers 321 through 323 on the quantized coefficients.

When the de-quantizers 321 through 323 are applied to decode the data encoded in units of block, the de-quantization unit 320 may adjust each offset value of the de-quantizers 321 through 323 by applying one piece of offset information to the de-quantizers 321 through 323, and then acquire the reconstructed data in the units of block by applying the data encoded in the units of block to the de-quantizers 321 through 323 of which offset values are adjusted. Alternatively, the de-quantization unit 320 may adjust the quantized coefficients related to the encoded data by applying one piece of offset information to the encoded data, and then acquire the reconstructed data in the units of blocks by applying the adjusted quantized coefficients to the de-quantizers 321 through 323.

When the de-quantizers 321 through 323 are applied to decode the data encoded in the units of block, the de-quantization unit 320 may adjust offset values of the de-quantizers 321 through 323 by applying a plurality of pieces of offset information to the de-quantizers 321 through 323, and then acquire the reconstructed data in the units of blocks by applying the encoded data to the de-quantizers 321 through 323 of which the offset values are adjusted. Alternatively, the de-quantization unit 320 may adjust the quantized coefficients related to the encoded data by applying a plurality of pieces of offset information respectively to the encoded data, and then acquire the reconstructed data in the units of blocks by applying the adjusted quantized coefficients to the de-quantizers 321 through 323.

The output unit 330 is a unit for outputting data. Examples of the data output by the output unit 330 include data having various formats, such as a still image, a moving image, audio, a text, data having a frequency format, etc. Also, when the decoder 300 receives compressed data on which preprocessing is performed, the output unit 330 may output the reconstructed data on which preprocessing is performed. For example, preprocessed data may include residual data corresponding to a difference between current data that is currently encoded, and predictive data found in a range adjacent to the current data.

The output unit 330 may output data in units of blocks. The data in units of blocks is generated by combining a plurality of pieces of data, and may be processed in the units of blocks by the de-multiplexing unit 310 and the de-quantization unit 320. The data in the units of blocks may include a residual block corresponding to a difference between the current block and the predictive block.

Equations 1 and 2 below represent quantization and de-quantization processes, according to an exemplary embodiment.

$$\text{Quant}(X,i)=\lfloor(X+Fi)/\Delta\rfloor \quad \text{[Equation 1]}$$

Equation 1 represents a quantization process according to an exemplary embodiment. Quant(X, i) denotes a quantized coefficient obtained by applying an X value of data received from the input unit 210 to an i-th quantizer, $\Delta$ denotes a quantization step size, and Fi denotes an offset value of the i-th quantizer. In Equation 1, the quantized coefficient Quant (X, i) may be acquired by moving the X value of data by the offset value, and dividing the moved X value of data by the quantization step size $\Delta$.

$$\text{DeQuant}(X',i)=(X'\cdot\Delta)+(\Delta/2-Fi) \quad \text{[Equation 2]}$$

Equation 2 represents a de-quantization process corresponding to Equation 1, according to an exemplary embodiment. De-quant(X', i) denotes a value of reconstructed data obtained by applying a quantized coefficient X' on an i-th de-quantizer, $\Delta$ denotes a quantization step size, and Fi denotes an offset value of the i-th de-quantizer. In Equation 2, the value De-quant(X', i) of the reconstructed data may be acquired by multiplying the quantization step size $\Delta$ by the quantized coefficient X', and then moving the quantized coefficient X' by the offset value.

Figure 4:
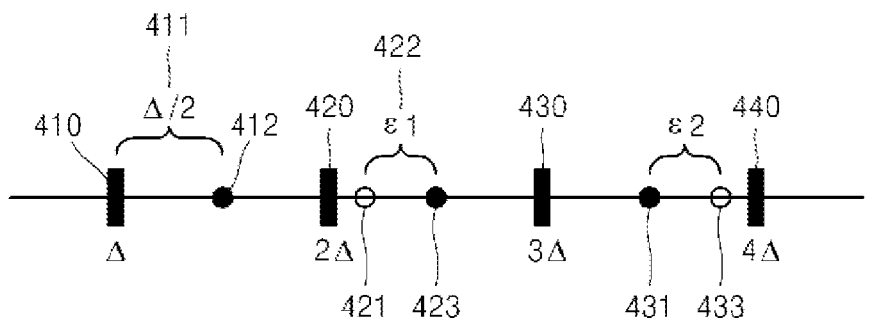
FIG. 4 is a diagram for describing quantization processes of a plurality of quantizers, according to an exemplary embodiment.
Figure 4:
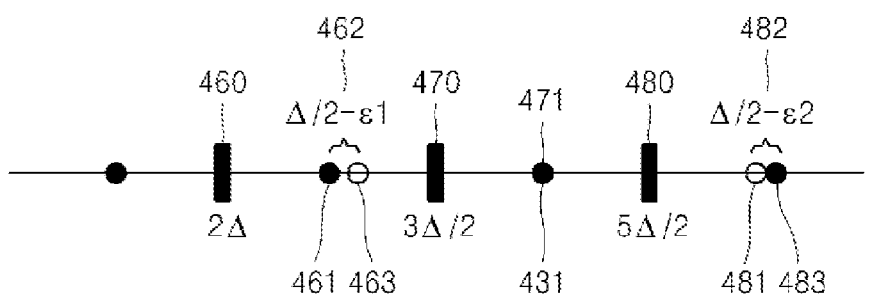

In Equations 1 and 2, when the offset values are respectively 0 and $\Delta/2$, the quantization and de-quantization processes are as shown in FIG. 4.

FIG. 4 is a diagram for describing quantization processes of a plurality of first and second quantizers 400 and 450 included in the quantization unit 220, and a quantizer determining process, according to an exemplary embodiment.

The first and second quantizers 400 and 450 of FIG. 4 are interleaved with each other, quantization step sizes of the first and second quantizers 400 and 450 are the same as $\Delta$, and the offset values of the first and second quantizers 400 and 450 are different by $\Delta/2$.

The first quantizer 400 from among the first and second quantizers 400 and 450 is divided into consecutive decision levels 410 through 440. Also, FIG. 4 illustrates original data 421 and 433 received by the first quantizer 400, and reconstructed data 412, 423, and 431 corresponding to the original data 421 and 422.

The second quantizer 450 from among the first and second quantizers 400 and 450 is divided into consecutive decision levels 460, 470, and 480. Also, FIG. 4 illustrates original data 463 and 481 received by the second quantizer 450, and reconstructed data 461 and 483 corresponding to the original data 463 and 481.

In detail, FIG. 4 illustrates the reconstructed data 423 reconstructed by de-quantizing the original data 421 when the original data 421 included between the decision level 420 and the decision level 430 is input to the first quantizer 400. Meanwhile, FIG. 4 illustrates the reconstructed data 461 reconstructed by de-quantizing the original data 463 when the original data 463 included between the decision level 460 and the decision level 470 is input to the second quantizer 450.

The quantizer determination unit 230 may calculate an error between data and reconstructed data. For example, when the first quantizer 400 receives the original data 421 and acquires the reconstructed data 423 corresponding to the original data 421, the quantizer determination unit 230 may acquire e1 422 corresponding to an error between the data 421 and the reconstructed data 423. Also, when the second quantizer 450 receives the original data 463 identical to the original data 421 input to the first quantizer 400, and acquires the reconstructed data 461 corresponding to the original data 463, the quantizer determination unit 230 may acquire $\Delta/2-e1$ 462 corresponding to an error between the original data 463 and the reconstructed data 461.

Then, the quantizer determination unit 230 may compare the e1 422 acquired from the first quantizer 400 and $\Delta/2-e1$ 462 acquired from the second quantizer 450, and transmit information related to the second quantizer shoulder 450 having the smaller error to the multiplexing unit 240. The information related to the second quantizer 450 may be an indicator indicating the second quantizer 450 or an offset value of the second quantizer 450.

When data input to the input unit 210 is a plurality of pieces of data included in a predetermined block, the quantizer determination unit 230 may determine a quantizer having the smallest error per block by applying the plurality of pieces of data to each quantizer. For example, when the original data 421 and 433 are applied to the first quantizer 400, errors between the original data 421 and 433 and the reconstructed data 423 and 431 may be respectively the e1 422 and e2 432, and an error of a block including the original data 421 and 433 may be a value obtained by adding the e1 422 and the e2 432. Also, when the original data 463 and 481 identical to the original data 421 and 433 input to the first quantizer 400 are applied to the second quantizer 450, errors between the original data 421 and 433 and the reconstructed data 461 and 483 may be respectively the Δ/2−e1 462 and Δ/2−e2 482, and an error of a block including the original data 463 and 481 may be a value obtained by adding the Δ/2−e1 462 and Δ/2−e2 482.

The quantizer determination unit 230 may compare the errors of blocks acquired from the first quantizer 400 and the second quantizer 450, and transmit an indicator or offset information related to a quantizer having the smallest error to the multiplexing unit 240.

The quantization and de-quantization processes related to the first quantizer 400 of FIG. 4 may be represented by Equations 3 and 4 below.

$$\text{Quant}(X,i) = \lfloor X/\Delta \rfloor \qquad \text{[Equation 3]}$$

In Equation 3, Quant(X, i) denotes a quantized coefficient, X denotes a value of input data, and Δ denotes a quantization step size. Here, the quantized coefficient Quant(X, i) may be acquired by dividing the value X by the quantization step size Δ.

$$\text{DeQuant}(X',i) = (X' \cdot \Delta) + \Delta/2 \qquad \text{[Equation 4]}$$

Equation 4 is the de-quantization process corresponding to Equation 3. De-quant(X', i) denotes a value of reconstructed data, X' denotes a quantized coefficient received from an encoder, and Δ denotes a de-quantization step size. The value De-quant(X', i) may be acquired by multiplying the quantized coefficient X' by the de-quantization step size Δ, and then adding a quantization offset value Δ/2 to the result.

Meanwhile, the quantization process of the second quantizer 450 in FIG. 4 may be represented by Equation 5 below.

$$\text{Quant}(X,i) = \lfloor (X+\Delta/2)/\Delta \rfloor \qquad \text{[Equation 5]}$$

In Equation 5, Quant(X, i) denotes a quantized coefficient, X denotes a value of input data, and Δ denotes a quantization step size. In Equation 5, the quantized coefficient Quant(X, i) may be acquired by adding a quantization offset value Δ/2 to the value X, and then dividing the result by the quantization step size Δ.

$$\text{DeQuant}(X',i) = (X' \cdot \Delta) \qquad \text{[Equation 6]}$$

Equation 6 represents a de-quantization process corresponding to Equation 5, wherein De-quant(X', i) denotes a value of reconstructed data, X' denotes a quantization representative value received from an encoder, and Δ denotes a de-quantization step size. The value X' may be acquired by multiplying the de-quantization step size Δ by the quantization representative value X'.

A quantization error may be reduced as much as possible when a plurality of quantizers having different offset values are used while compensating for each other. For example, when two quantizers of which a difference of offset values is Δ/2, such as the first and second quantizers 400 and 450 of FIG. 4, are used, when an error generated in one quantizer is e, an error generated in another quantizer may be indicated by Δ/2−e. If N pieces of data in one block is applied to the first and second quantizers 400 and 450, errors of the N pieces of data generated in one quantizer are ei, wherein ei is 0 and i is from 1 to N, and errors of the N pieces of data generated in another quantizer are Δ/2−ei, wherein Δ/2−ei is 0 and i is from 1 to N. Here, a sum of errors of quantizers may be represented by Equation 7 below.

$$SAD_{Q1} = \Sigma_1^N \epsilon i$$

$$SAD_{Q1} = \Sigma_1^N (\Delta/2 - \epsilon i) \qquad \text{[Equation 7]}$$

In Equation 7, $SAD_{Q1}$ denotes an absolute sum of errors when the N pieces of data are applied to the first quantizer 400, and $SAD_{Q2}$ denotes an absolute sum of errors when the N pieces of data are applied to the second quantizer 450. Here, a sum of SAD of each quantizer is N·Δ/2 constituting the maximum error, and thus when a quantizer having the smallest error is selected, an SAD of the block may exist between 0 and N·Δ/4.

An encoding method performed by the encoder 200, according to exemplary embodiments will now be described with reference to FIGS. 5 and 6.

Figure 5:
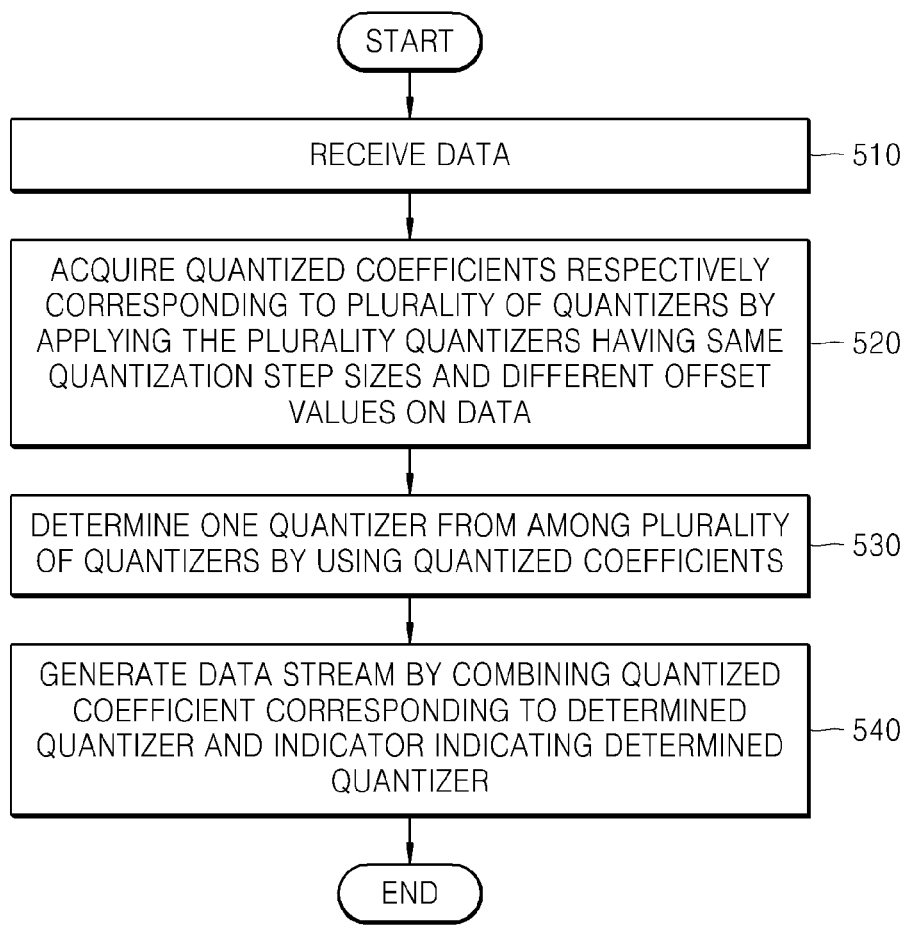
FIG. 5 is a flowchart illustrating an encoding method performed by an encoder, according to an exemplary embodiment.

FIG. 5 is a flowchart illustrating an encoding method performed by the encoder 200, according to an exemplary embodiment.

The encoder 200 according to the current exemplary embodiment receives data in operation 510. The encoder 200 may receive preprocessed data. For example, the preprocessed data may be residual data corresponding to a difference between current data that is currently encoded and predictive data found in a range adjacent to the current data. Also, the encoder 200 may receive preprocessed data in units of blocks. The preprocessed data in the units of blocks may include a residual block corresponding to a difference between the current block and the predictive block.

The encoder 200 acquires quantized coefficients respectively corresponding to a plurality of quantizers in operation 520, by applying the quantizers on the data received in operation 510. Here, the quantizers may have the same quantization step sizes and different offset values.

When the data received in operation 510 is data in a predetermined block, the encoder 200 may apply the same quantizer to a plurality of pieces of data in the predetermined block. Alternatively, the encoder 200 may apply the same quantizer to some pieces of data from among the plurality of pieces of data in the predetermined block.

The encoder 200 may apply scaling information for adjusting the quantization step sizes of the quantizers. The encoder 200 may output a quantization coefficient by applying the quantizers applied with the scaling information to the data received in operation 510. The scaling information may include a scaling value or a value representing the scaling value as information for increasing or decreasing the quantization step size.

The encoder 200 determines one quantizer from among the quantizers in operation 530 by using the quantized coefficients acquired in operation 520. For example, the encoder 200 may acquire a reconstructed value by de-quantizing the quantized coefficients, and determine one quantizer from among the quantizers based on an error between the reconstructed value and the data.

The encoder 200 generates a data stream in operation 540, by combining the quantized coefficient of the determined quantizer, and an indicator indicating the determined quantizer. Also, the encoder 200 may generate the data stream by further combining the scaling information for adjusting the quantization step size. When the data received in operation 510 is data included in a predetermined block, the encoder 200 may transmit one piece of indicator information per block.

Figure 6:
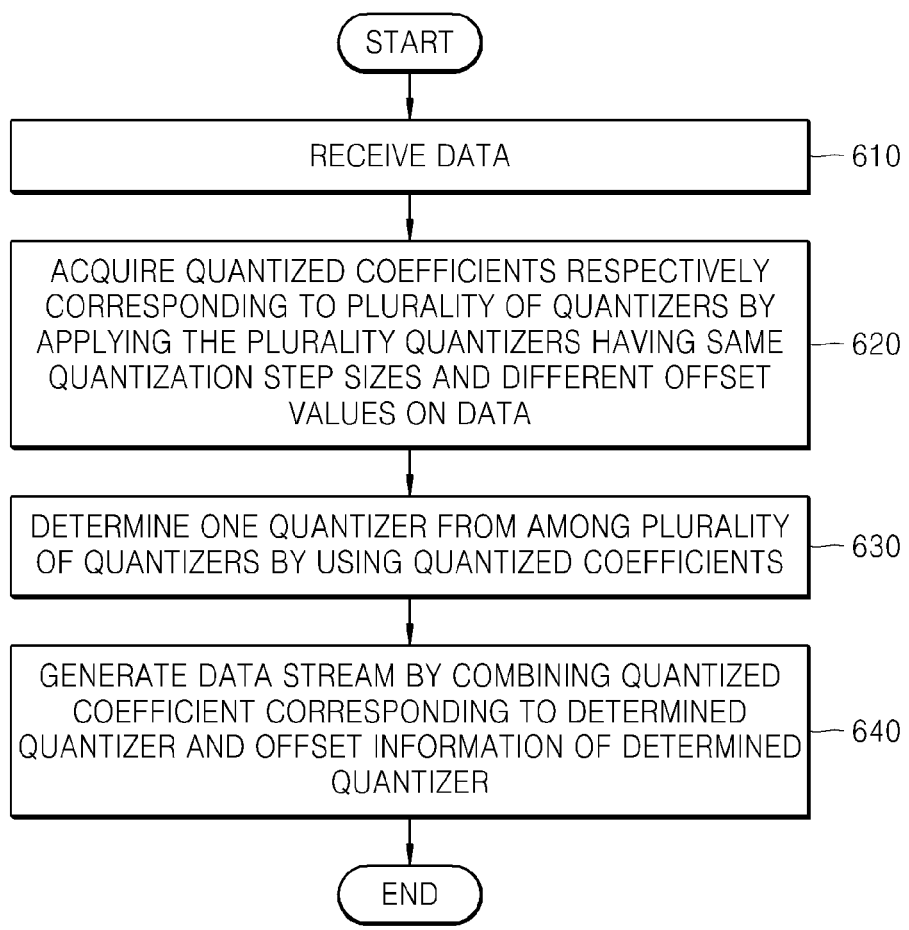
FIG. 6 is a flowchart illustrating an encoding method performed by the encoder, according to another exemplary embodiment.

FIG. 6 is a flowchart illustrating an encoding method performed by the encoder 200, according to another exemplary embodiment.

The encoder 200 receives data in operation 610. The encoder 200 may receive preprocessed data. For example, the preprocessed data may be residual data corresponding to a difference between current data that is currently encoded and predictive data found in a range adjacent to the current data. Also, the encoder 200 may receive preprocessed data in units of blocks. The preprocessed data in the units of blocks may include a residual block corresponding to a difference between the current block and the predictive block.

The encoder 200 acquires quantized coefficients respectively corresponding to a plurality of quantizers in operation 620, by applying the quantizers to the data received in operation 610. Here, the quantizers may have the same quantization step sizes and different offset values.

When the data received in operation 610 is data in a predetermined block, the encoder 200 may apply the same quantizer to a plurality of pieces of data in the predetermined block. Alternatively, the encoder 200 may apply the same quantizer to some pieces of data from among the plurality of pieces of data in the predetermined block.

The encoder 200 may apply scaling information for adjusting the quantization step sizes of the quantizers. The encoder 200 may output a quantization coefficient by applying the quantizers applied with the scaling information to the data received in operation 610. The scaling information may include a scaling value or a value representing the scaling value as information for increasing or decreasing the quantization step size.

The encoder 200 determines one quantizer from among the quantizers in operation 630 by using the quantized coefficients acquired in operation 620. For example, the encoder 200 may acquire a reconstructed value by de-quantizing the quantized coefficients, and determine one quantizer from among the quantizers based on an error between the reconstructed value and the data.

The encoder 200 generates a data stream in operation 640, by combining the quantized coefficient of the determined quantizer, and offset information of the determined quantizer. The offset information may be at least one of an offset value of the determined quantizer and information for acquiring the offset value. The information for acquiring the offset value may include a value for dividing a quantization step size of the determined quantizer into a predetermined size, or a value representing the offset value.

Also, the encoder 200 may generate the data stream by further combining the scaling information for adjusting the quantization step size. When the data received in operation 610 is data included in a predetermined block, the encoder 200 may transmit one piece of indicator information per block.

Figure 7:
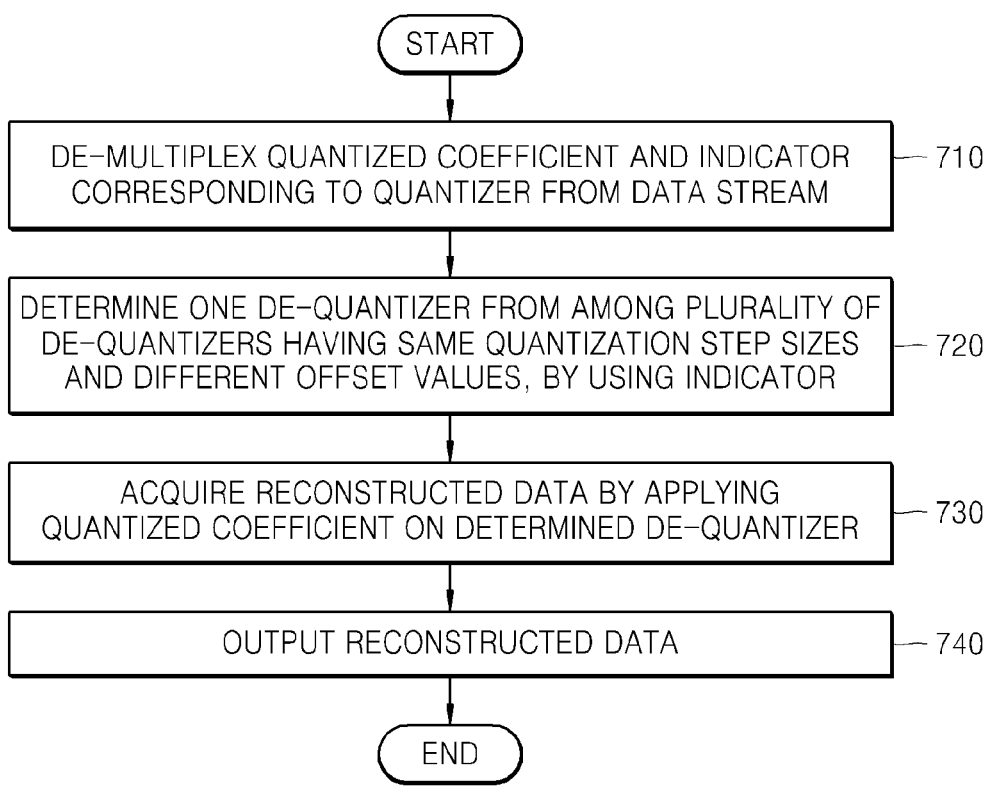
FIG. 7 is a flowchart illustrating a decoding method performed by a decoder, according to an exemplary embodiment.

FIG. 7 is a flowchart illustrating a decoding method performed by the decoder 300, according to an exemplary embodiment.

The decoder 300 receives a data stream from the encoder 200, and de-multiplexes a quantized coefficient and an indicator corresponding to a quantizer from the data stream, in operation 710. Also, the decoder 300 may de-multiplex scaling information for adjusting a quantization step size. The scaling information may include a scaling value or a value representing the scaling value, as information for increasing or decreasing the quantization step size. If the data received from the encoder 200 includes data encoded in units of predetermined blocks, the encoder 300 may de-multiplex one indicator per block.

The decoder 300 determines one de-quantizer from among a plurality of de-quantizers by using the indicator acquired in operation 710, in operation 720. Here, the de-quantizers may have the same quantization step sizes and different offset values. When data encoded in units of predetermined blocks is included in the data stream acquired in operation 710, the decoder 300 may apply the same de-quantizer to some pieces of data from among a plurality of pieces of data in a predetermined block. Alternatively, the decoder 300 may apply the same de-quantizer to all pieces of data in the predetermined block.

The decoder 300 acquires reconstructed data in operation 730 by applying the quantized coefficient to the de-quantizer determined in operation 720. For example, the decoder 300 may acquire the reconstructed data by multiplying the de-quantization step size and the quantized coefficient of the de-quantizer determined by the indicator.

The decoder 300 may apply scaling information so as to adjust the quantization step size of the de-quantizer determined by the indicator. For example, the decoder 300 may apply the scaling information on the de-quantizer determined by the indicator from among the de-quantizers, and acquire the reconstructed data by applying the quantized coefficient on the de-quantizer applied with the scaling information. The scaling information may include a scaling value or a value representing the scaling value as information for increasing or decreasing the de-quantization step size.

The decoder 300 outputs the reconstructed data in operation 740. If compressed data on which preprocessing is performed is received, the decoder 300 may output reconstructed data on which preprocessing is performed. For example, the compressed data on which preprocessing is performed may include residual data corresponding to a difference between current data that is currently encoded, and predictive data found in a range adjacent to the current data. Alternatively, the decoder 300 may output data in units of blocks. The data in the units of blocks is obtained by combining a plurality of pieces of data, and may include a residual block corresponding to a difference between the current block and the predictive block.

Figure 8:
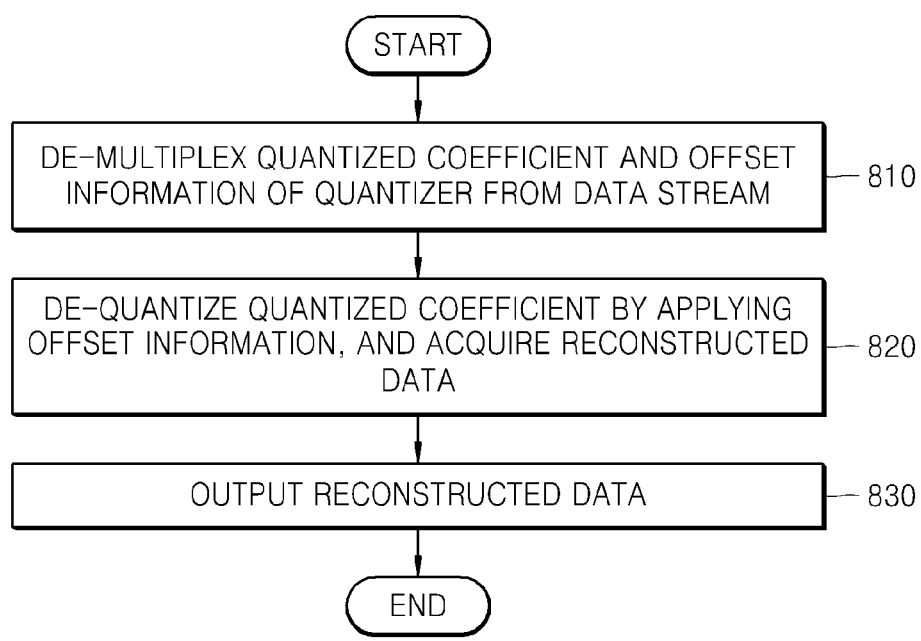
FIG. 8 is a flowchart illustrating a decoding method performed by the decoder, according to another exemplary embodiment.

FIG. 8 is a flowchart illustrating a decoding method performed by the decoder 300, according to another exemplary embodiment. The decoder 300 receives a data stream from the encoder 200, and de-multiplexes a quantized coefficient and offset information of a quantizer from the data stream, in operation 810. The offset information is information related to an offset, and may include at least one of an offset value of the quantizer and information for acquiring the offset value. The decoder 300 may de-multiplex scaling information for adjusting a quantization step size. The scaling information may include a scaling value or a value representing the scaling value, as information for increasing or decreasing the quantization step size. Alternatively, if the data received from the encoder 200 includes data encoded in units of predetermined blocks, the decoder 300 may de-multiplex one piece of offset information per block.

The decoder 300 de-quantizes the quantized coefficient and acquires reconstructed data in operation 820 by applying the offset information acquired in operation 810. The offset information is information related to offset, and may include at least one of an offset value of the quantizer and information for acquiring the offset value. The information for acquiring the offset value may include a value for dividing a de-quantization step size of a de-quantizer included in the decoder 300 into a predetermined size, or a value representing the offset value.

When the reconstructed data is acquired by using the offset information, the decoder 300 may adjust the offset value of the de-quantizer included in the decoder 300 by using the offset information, and acquire the reconstructed data by applying the quantized coefficient on the de-quantizer of which the offset value is adjusted. Alternatively, the decoder 300 may adjust the quantized coefficient by using the offset information, and acquire the reconstructed data by applying the adjusted quantized coefficient on the de-quantizer included in the decoder 300.

When the data stream acquired in operation 810 includes data encoded in units of blocks including a plurality of quantized coefficients, the decoder 300 may apply the quantized coefficients in the units of blocks to one de-quantizer. Alternatively, the decoder 300 may de-quantize the quantized coefficient by applying the offset information to the de-quantizers, and acquire the reconstructed data. Alternatively, the decoder 300 may de-quantize the quantized coefficients by applying a plurality of pieces of offset information to each of the de-quantizers, and acquire the reconstructed data.

The decoder 300 may apply the scaling information acquired in operation 810 so as to adjust the quantization step size of the de-quantizer determined by using the indicator. For example, the decoder 300 may apply the scaling information to the de-quantizer included in the decoder 300, and acquire the reconstructed data by applying the quantized coefficient on the de-quantizer applied with the scaling information. The scaling information may include a scaling value or a value representing the scaling value, as information for increasing or decreasing the de-quantization step size.

The decoder 300 outputs the reconstructed data in operation 830. If compressed data on which preprocessing is performed is received, the decoder 300 may output reconstructed data on which preprocessing is performed. For example, the compressed data on which preprocessing is performed may include residual data corresponding to a difference between current data that is currently encoded, and predictive data found in a range adjacent to the current data. Alternatively, the decoder 300 may output data in units of blocks. The data in the units of blocks is obtained by combining a plurality of pieces of data, and may include a residual block corresponding to a difference between the current block and the predictive block.

The methods described above may be recorded on a computer readable recording medium by being realized in computer programs executed by using various computers. The computer readable recording medium may include at least one of a program command, a data file, and a data structure. The program commands recorded in the computer readable recording medium may be specially designed or well known to one of ordinary skill in the computer software field. Examples of the computer readable recording medium include read-only memory (ROM), random-access memory (RAM), CD-ROMs, magnetic tapes, floppy disks, optical data storage devices, etc. Examples of the computer command include mechanical codes prepared by a compiler, and high-level languages executable by a computer by using an interpreter. A hardware device may be configured to operate as at least one software module to perform operations of the methods, or vice versa. Moreover, one or more units of the encoder 200 and decoder 300 can include a processor or microprocessor executing a computer program stored in a computer-readable medium.

While exemplary embodiments have been particularly shown and described above, it will be understood by those of ordinary skill in the art that various changes in form and details may be made therein without departing from the spirit and scope of the present inventive concept as defined by the following claims.

What is claimed is:

1. An apparatus for encoding data, the apparatus comprising:
    an input unit which receives data;
    a quantization unit which acquires a plurality of quantized coefficients respectively corresponding to a plurality of quantizers by applying the plurality of quantizers to the data, wherein each of the plurality of quantizers has an intrinsic offset value;
    a quantizer determination unit which determines one quantizer from among the plurality of quantizers by using the acquired plurality of quantized coefficients respectively corresponding to the plurality of quantizers; and
    a multiplexing unit which generates a data stream by combining a quantized coefficient corresponding to the determined one quantizer, and an indicator indicating the determined quantizer,
    wherein quantization step sizes of the plurality of quantizers are equal, and offset values of the plurality of quantizers are different from each other.

2. The apparatus of claim 1, wherein the quantizer determination unit de-quantizes the acquired plurality of quantized coefficients respectively corresponding to the plurality of quantizers to acquire a plurality of reconstructed values respectively corresponding to the plurality of quantizers, and determines the one quantizer from among the plurality of quantizers based on an error between a reconstructed value and the data.

3. An apparatus for encoding data, the apparatus comprising:
    an input unit which receives data;
    a quantization unit which acquires a plurality of quantized coefficients respectively corresponding to a plurality of quantizers by applying the plurality of quantizers to the data, wherein each of the plurality of quantizers has an intrinsic offset value;
    a quantizer determination unit which determines one quantizer from among the plurality of quantizers by using the acquired plurality of quantized coefficients respectively corresponding to the plurality of quantizers; and
    a multiplexing unit which generates a data stream by combining a quantized coefficient corresponding to the determined one quantizer, and offset information of the determined one quantizer,
    wherein quantization step sizes of the plurality of quantizers are equal, and offset values of the plurality of quantizers are different from each other.

4. The apparatus of claim 3, wherein the quantizer determination unit de-quantizes the acquired plurality of quantized coefficients respectively corresponding to the plurality of quantizers to acquire a plurality of reconstructed values respectively corresponding to the plurality of quantizers, and determines the one quantizer from among the plurality of quantizers based on an error between a reconstructed value and the data.

5. An apparatus for decoding data, the apparatus comprising:
- a de-multiplexing unit which de-multiplexes, from a data stream, a quantized coefficient and an indicator corresponding to a quantizer;
- a de-quantization unit which determines one de-quantizer from among a plurality of de-quantizers by using the indicator, and acquires reconstructed data by applying the quantized coefficient to the determined one de-quantizer, wherein each of the plurality of de-quantizers has an intrinsic offset value; and
- an output unit which outputs the reconstructed data,
- wherein quantization step sizes of the plurality of de-quantizers are equal, and offset values of the plurality of de-quantizers are different from each other.

6. The apparatus of claim 5, wherein, when the data stream comprises data encoded in units of predetermined blocks, the de-quantization unit applies the one de-quantizer to a plurality of pieces of data in a predetermined block.

7. The apparatus of claim 6, wherein the indicator is determined in the units of predetermined blocks.

8. The apparatus of claim 5, wherein the reconstructed data is a difference between current data and predictive data.

9. The apparatus of claim 5, wherein:
- the de-multiplexing unit further de-multiplexes, from the data stream, scaling information for adjusting a quantization step size of the determined one de-quantizer, and
- the de-quantization unit acquires the reconstructed data by applying the scaling information and the quantized coefficient to the determined one de-quantizer.

10. An apparatus for decoding data, the apparatus comprising:
- a de-multiplexing unit which separates, from a data stream, a quantized coefficient and offset information of a quantizer;
- a de-quantization unit which de-quantizes the quantized coefficient by using the offset information, to acquire reconstructed data; and
- an output unit which outputs the reconstructed data.

11. The apparatus of claim 10, wherein the data stream comprises data encoded in units of predetermined blocks, and the offset information is determined in the units of predetermined blocks.

12. The apparatus of claim 10, wherein the de-quantization unit comprises a plurality of de-quantizers for decoding data encoded in units of blocks, de-quantizes the quantized coefficient by applying the offset information to the plurality of de-quantizers, and acquires the reconstructed data.

13. The apparatus of claim 10, wherein the de-quantization unit adjusts an offset value of a de-quantizer included in the de-quantization unit by using the offset information, and acquires the reconstructed data by applying the quantized coefficient to the de-quantizer of which the offset value is adjusted.

14. The apparatus of claim 10, wherein the de-quantization unit adjusts the quantized coefficient by using the offset information, and acquires the reconstructed data by applying the adjusted quantized coefficient to a de-quantizer included in the de-quantization unit.

15. The apparatus of claim 10, wherein:
- the de-multiplexing unit further separates, from the data stream, scaling information for adjusting a quantization step size of a de-quantizer, and
- the de-quantization unit de-quantizes the quantized coefficient by applying the scaling information and the offset information, to acquire the reconstructed data.

16. A method of decoding data, performed by an apparatus for decoding data, the method comprising:
- de-multiplexing, from a data stream, a quantized coefficient and an indicator corresponding to a quantizer;
- determining one de-quantizer from among a plurality of de-quantizers by using the indicator, wherein each of the plurality of de-quantizers has an intrinsic offset value;
- acquiring reconstructed data by applying the quantized coefficient to the determined one de-quantizer; and
- outputting the reconstructed data,
- wherein quantization step sizes of the plurality of de-quantizers are equal, and offset values of the plurality of de-quantizers are different from each other.

17. The method of claim 16, wherein, when the data stream comprises data encoded in units of predetermined blocks, the one de-quantizer is applied to a plurality of pieces of data in a predetermined block.

18. A method of decoding data, performed by an apparatus for decoding data, the method comprising:
- separating, from a data stream, a quantized coefficient and offset information of a quantizer;
- de-quantizing the quantized coefficient by using the offset information, to acquire reconstructed data; and
- outputting the reconstructed data.

19. The method of claim 18, wherein the data stream comprises data encoded in units of predetermined blocks, and the offset information is determined in the units of predetermined blocks.

20. A method of encoding data, performed by an apparatus for encoding data, the method comprising:
- acquiring a plurality of quantized coefficients respectively corresponding to a plurality of quantizers by applying the plurality of quantizers to data, wherein each of the plurality of quantizers has an intrinsic offset value;
- determining one quantizer from among the plurality of quantizers by using the acquired plurality of quantized coefficients respectively corresponding to the plurality of quantizers; and
- generating a data stream by combining a quantized coefficient corresponding to the determined quantizer, and information corresponding to the determined quantizer,
- wherein quantization step sizes of the plurality of quantizers are equal, and offset values of the plurality of quantizers are different from each other.

21. The method of claim 20, wherein the information corresponding to the determined quantizer comprises offset information of the determined quantizer.

22. The method of claim 20, wherein the information corresponding to the determined quantizer comprises an indicator indicating the determined quantizer.

23. A computer readable recording medium having recorded thereon a program executable by a computer for performing the method of claim 16.

24. A computer readable recording medium having recorded thereon a program executable by a computer for performing the method of claim 18.

25. A computer readable recording medium having recorded thereon a program executable by a computer for performing the method of claim 20.

* * * * *